United States Patent [19]

Cho

[11] Patent Number: 5,337,278
[45] Date of Patent: Aug. 9, 1994

[54] LOW-POWER DECODER FOR SELECTING REDUNDANT MEMORY CELLS

[75] Inventor: Shizuo Cho, Miyazaki, Japan

[73] Assignee: Oki Electric Industry Co., Ltd., Tokyo, Japan

[21] Appl. No.: 19,154

[22] Filed: Feb. 17, 1993

[30] Foreign Application Priority Data

Feb. 18, 1992 [JP] Japan .................. 4-030802

[51] Int. Cl.$^5$ .............................. G11C 13/00
[52] U.S. Cl. ......................... 365/200; 365/201; 365/227; 365/230.06; 365/225.7
[58] Field of Search ........... 365/200, 225.7, 201, 365/227, 230.06

[56] References Cited

U.S. PATENT DOCUMENTS

| | | | |
|---|---|---|---|
| 4,689,494 | 8/1987 | Chen et al. | 365/200 |
| 4,860,260 | 8/1989 | Saito et al. | 365/201 |
| 4,951,253 | 8/1990 | Sahara et al. | 365/200 |
| 4,985,866 | 1/1991 | Nakaizumi | 365/200 |
| 5,058,059 | 10/1991 | Matsuo et al. | 365/200 |

Primary Examiner—Eugene R. LaRoche
Assistant Examiner—Tan Ngnyen
Attorney, Agent, or Firm—Edward D. Manzo

[57] ABSTRACT

To avoid unnecessary power dissipation, a decoder for selecting redundant memory cells in a memory device provides, for each section of the memory device, a first node and a second node that are coupled through a fuse-programmable ROM. If a defective memory cell is found in a section of the memory device, the fuse-programmable ROM of that section is programmed so as to decouple the first node from the second node when the defective memory cell is addressed. Prior to every access cycle, the first and second nodes of all sections are precharged. When address signals are received, the second node of the addressed section is discharged, other second nodes remaining charged. Normal or redundant memory cells are selected by performing a logic operation on the potentials of the first nodes.

18 Claims, 6 Drawing Sheets

LOW-POWER DECODER FOR SELECTING REDUNDANT MEMORY CELLS

BACKGROUND OF THE INVENTION

This invention relates to a fuse-programmable decoder for selecting redundant memory cells in a semiconductor memory device such as a dynamic random-access memory, static random-access memory, electrically erasable and programmable read-only memory, or other type of memory.

As the integration density of memory devices has increased, it has become necessary to reduce power dissipation by dividing the memory cell array into multiple sections, only one of which operates in any given access cycle. To improve production yields, each section is provided with redundant memory cells. If a defective memory cell is found during testing by the manufacturer, the device is programmed so that when the defective cell is addressed, a redundant memory cell will be accessed instead.

For this purpose, the device is provided with a fuse-programmable decoder to decode address signals and select redundant memory cells when pre-programmed addresses appear. The decoder operates by precharging a node to the power-supply potential, then allowing the node to discharge through a network of transistors and fusible links, referred to herein as a fuse-programmable ROM, if the address does not match a pre-programmed address. A separate node and fuse-programmable ROM are provided for each section of the memory device. (ROM stands for road-only memory.)

A problem with existing fuse-programmable decoders is that even though only one section of the memory cell array will be selected, in every memory access cycle al decoder nodes are precharged, and all the nodes corresponding to non-selected sections must be discharged. This leads to unnecessary current drain and power dissipation.

A further problem is that when a node is discharged, the source and drain electrodes of transistors coupled to that node are both placed at the ground potential. These transistors become equivalent to single capacitors coupled between the address signal lines and ground, placing a large capacitive load on the address signal lines, which slows memory operation and leads to more unnecessary power dissipation.

SUMMARY OF THE INVENTION

It is accordingly an object of the present invention to select redundant memory cells without unnecessary current drain.

Another object of the invention is to reduce capacitive load on address signal lines.

To select redundant memory cells in a memory device, the invented decoder provides, for each section of the memory device, a first node, a second node, and a fuse-programmable ROM. Normally the first node is electrically coupled to the second node through the fuse-programmable ROM, but if a defective memory cell is found in a particular section of the memory device, the fuse-programmable ROM of that section is programmed so as not to couple the first node of that section to the second node of that section when the defective memory cell is addressed.

Prior to every access cycle, the first and second nodes of all sections are precharged to the power-supply potential. During a memory access cycle, address signals are received and the second node of the addressed section is discharged to ground. If the address signals select a normal memory cell, then the first node of that section, being electrically coupled to the second node, also discharges. If a defective memory cell is addressed, then the first node, being electrically decoupled from the second node, remains at the power-supply potential.

The potentials of the first nodes for all sections of the memory device are input to a logic gate, which generates an output signal. The output signal can be used to select whether to access the addressed memory cell or a redundant memory cell.

DETAILED DESCRIPTION OF THE INVENTION

The invention will now be described in more detail with reference to the attached illustrative drawings. For simplicity, the drawings show a decoder for a memory that is divided into only two sections, but the invention is of course not restricted to this case. Indeed, the invention becomes more effective as the number of sections increases.

In the description and drawings, the power-supply potential will be denoted by the word "high", and upward-pointing arrow, or the symbol $V_{CC}$. Ground potential will be denoted by the word "low," zero volts, or the conventional symbol for ground.

Figure 1:
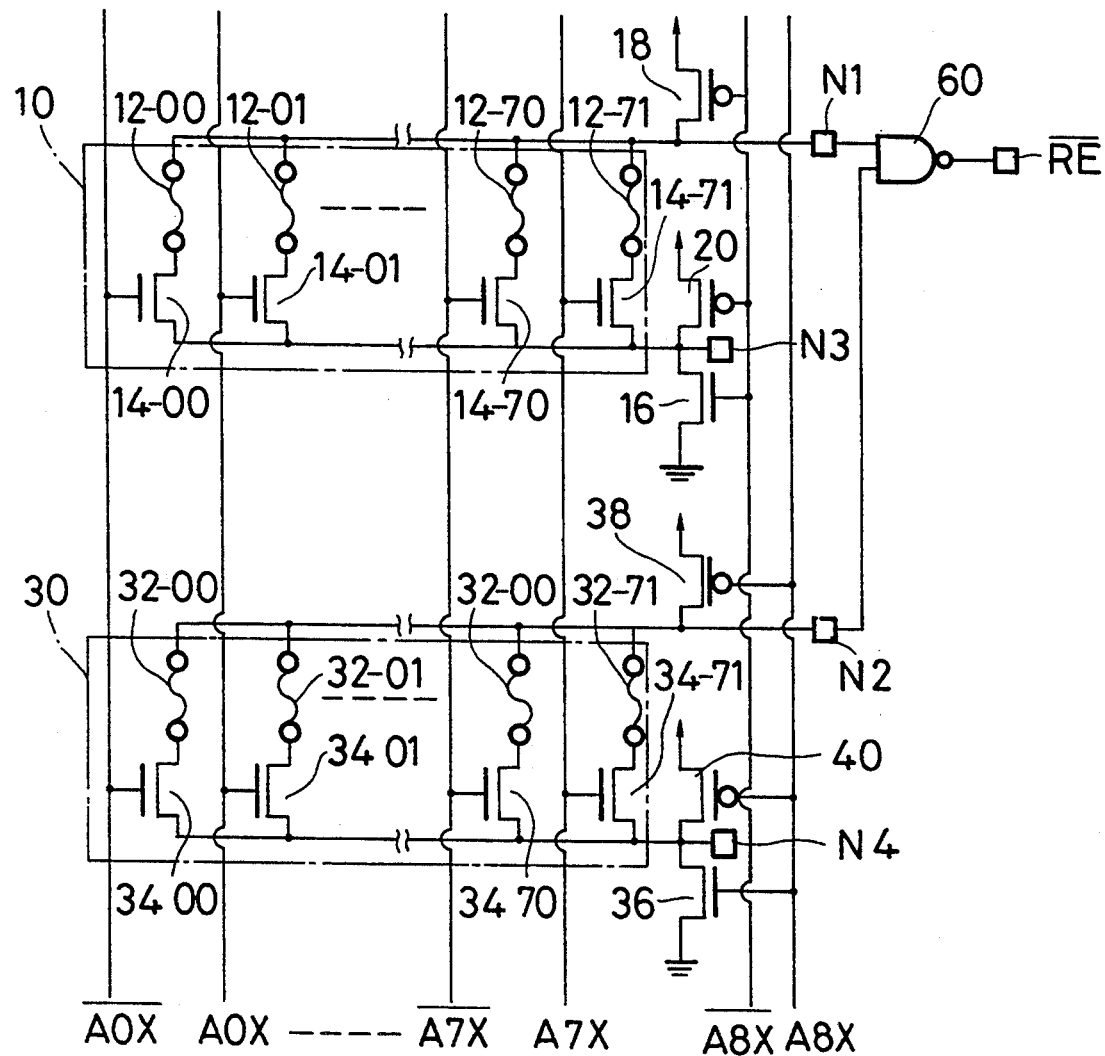
FIG. 1 is a circuit diagram according to aspects of the invented fuse-programmable decoder.

Referring to FIG. 1, the invented decoder receives a plurality of address signals designated A0X to A8X, and a plurality of complementary address signals designated $\overline{A0X}$ to $\overline{A8X}$. These are internal address signals that are generated from external address signals A0 to A8 by circuits in the memory devices of which the decoder is one part. The two sections of the memory are selected by address bit A8. The first section is selected when A8 is a logic zero, in which case A8X is low and $\overline{A8X}$ is high; the second section is selected A8 is a logic one, in which cases when A8X is high and $\overline{A8X}$ is low.

In a memory device divided into more than two sections, a larger number of address bits must be used to select the sections, and the circuits shown in the drawings must be modified accordingly. The modifications, which will be obvious to those skilled in the art, are omitted from the drawings in order to avoid obscuring the invention with unnecessary detail. Also omitted, for the same reason, are the external address signals, the above-mentioned circuits for generating the internal address signals, the memory cell array, its redundant memory cells, and other parts of the memory device not directly related to the invention.

For the first section of the memory, the invented decoder provides a pair of nodes N1 and N3 and a first fuse-programmable ROM 10. The fuse-programmable ROM 10 comprises a plurality of fusible links 12-00 to 12-71, which are coupled to the drain electrodes of a like plurality of n-channel metal-oxide-semiconductor field-effect transistors (referred to hereinafter at NMOS transistors) 14-00 to 14-71. Address signals $\overline{A0X}$ to $\overline{A7X}$ drive the gate electrodes of the odd-numbered NMOS transistors 14-01 to 14-71, while address signals A0X to A7X drive the gate electrodes of the even-numbered NMOS transistors 14-00 to 14-70. The source electrodes of the NMOS transistors 14-00 to 14-71 are coupled in common to node N3. The fusible links 12-00 to 12-71 are coupled in common to node N1.

An additional NMOS transistors 16 couples node N3 to ground potential. A pair of p-channel metal-oxide-semiconductor field-effect transistors (referred to hereinafter as PMOS transistors) 18 and 20 coupled the nodes N1 and N3 to the power-supply potential. The gates of these three transistors 16, 18, and 20 are driven by the address signal $\overline{A8X}$.

For the second section of the memory, the decoder has a pair of nodes N2 and N4, a second fuse-programmable ROM 30 comprising a plurality of fusible links 32-00 to 32-71 and NMOS transistors 34-00 to 34-71, an NMOS transistor 36, and PMOS transistors 38 and 40. These are interconnected in a fashion analogous to the above, the transistors 36, 38, and 40 being driven by the A8X address signal.

Nodes N1 and N2 are coupled to a two-input NAND gate 60, which generates an output signal $\overline{RE}$. The signal $\overline{RE}$ selects normal memory cells when high and redundant memory cells when low.

In the summary of the invention and the claims, nodes N1 and N2 are referred to as "first nodes," while node N3 and N4 are referred to as "second nodes."

When the memory device is fabricated, all the fusible links 12-00 to 12-71 and 32-00 to 32-71 are originally intact; that is, they are in the electrically conducting state. When the memory device is tested, if a defective memory cell is found at a certain address, the decoder is programmed for that address as follows.

If the defective memory cell is located in the first section of the memory, so that bit A8 of the address of the defective memory cell has the logic value zero, half of the fusible links in the first fuse-programmable ROM 10 are cut. If bit A0 of the defective address has the logic value zero, fuse 12-00 is cut and fuse 12-01 is left intact. If A0 has the logic value one, fuse 12-01 is cut and fuse 12-00 is left intact. Other pairs of fusible links in the first fuse-programmable ROM 10 are programmed similarly. The cutting is performed by, for example, a beam of laser light.

If the defective memory cell is located in the second section of the memory, so that bit A8 of the address has the logic value one, the fusible links in the second fuse-programmable ROM 30 are programmed in the same way. If defective memory cells are found in both sections of the memory, both the first fuse-programmable ROM 10 and the second fuse-programmable ROM 30 are programmed. The decoder can thus store the address of one defective memory cell in each section of the memory device.

The operation of the invention will be explained under the assumption that the decoder has been programmed with the address of a defective memory cell located in the first section of the memory, the section for which address bit A8 has the value zero, by cutting fusible links in the first fuse-programmable ROM 10.

Figure 2:
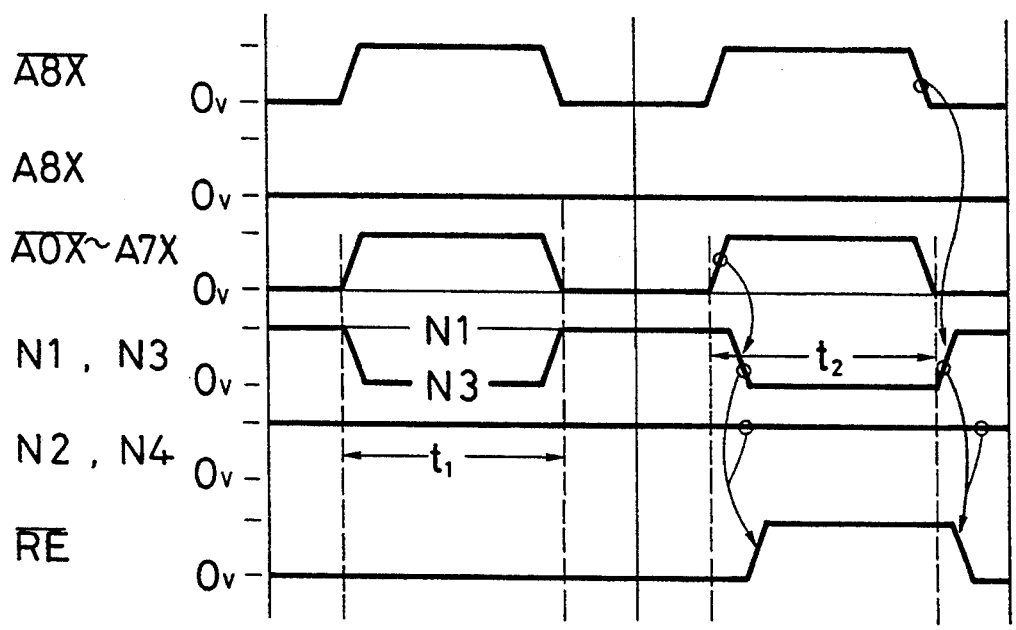
FIG. 2 is a timing diagram illustrating the operation of the invented fuse-programmable decoder.

Referring to FIG. 2, prior to the interval $t_1$ all address signals are low, so all NMOS transistors in FIG. 1 are turned off and all PMOS transistors are turned on. Nodes N1, N2, N3, and N4 charge to the high level through PMOS transistors 18, 38, 20, and 40, respectively.

During interval $t_1$, address is input. If address bit A8 is zero, then address signal A8X retains low while address signal $\overline{A8X}$ goes high, as shown. The high $\overline{A8X}$ signal turns on NMOS transistor 16 and turns off PMOS transistors 18 and 20, so node N1 is decoupled from the power-supply potential and node N3 is coupled to ground. The low A8X signal keeps NMOS transistor 36 turned off and PMOS transistors 38 and 40 turned on, so nodes N2 and N4 remain coupled to the power supply. As a result, node N3 goes low, node N2 and N4 remain high, and the state of node N1 depends on the other address signals as explained next.

The pairs of address signals from A0X and $\overline{A0X}$ to A7X and $\overline{A7X}$ also take on mutually complementary values. If these values match the defective memory cell address programmed into the first fuse-programmable ROM 10, then the first fuse-programmable ROM 10 remains in a non-conducting state, all of the NMOS transistors that turn on in the first fuse-programmable ROM 10 being coupled to fusible links that have been cut. Node N1 then retains its charge and stays high, as shown. Since node N1 and N2 are both high, the output signal $\overline{RE}$ generated by the NAND gate 60 stays low. This causes a redundant memory cell to be accessed in the first section of the memory. The second section remains inactive, since bit A8 is low, so it is not affected by the low $\overline{RE}$ output.

After interval $t_1$, all address signals go low and node N3 is precharged again. In interval $t_2$ another address is input, in which bit A8 is again zero. Once more node N3 discharges. If this time the values of A0X and $\overline{A0X}$ to A7X and $\overline{A7X}$ do not match the pre-programmed address, then at least one of the NMOS transistors that turns on in the first fuse-programmable ROM 10 is connected to an intact fusible link, and node N1 is electrically coupled through that fusible link and transistor to node N3. Node N1 therefore discharges and goes low together with node N3, as shown, causing the output signal $\overline{RE}$ to go high. In this state a redundant memory cell is not selected.

If the least significant bit A8 of the input address is one, selecting the second section of the memory (a case not illustrated in the drawings), then address signal A8X goes high an $\overline{A8X}$ stays low. As a result, NMOS transistor 16 remains off and PMOS transistors 18 and 20 remain on, so node N1 and N3 remain high and need not be discharged.

To summarize, in any memory access cycle, the pairs of nodes of all non-selected sections of the memory device remain high and do not have to be discharged. Only the pair of node corresponding to the selected section has to be discharged. When a defective memory cell is addressed, only remaining high.

Figure 3:
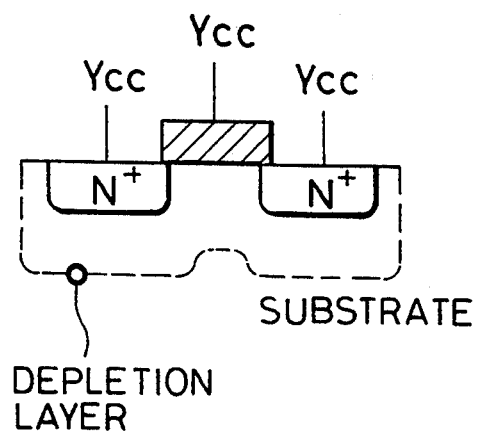
FIG. 3 a sectional view of a transistor in the invented fuse-programmable decoder.

FIG. 3 is a sectional view of one of the NMOS transistors in the second fuse-programmable ROM 30 during the time intervals shown in FIG. 2. The source and drain electrodes of this transistor are coupled to nodes N4 and N2, which are both coupled to the power supply. Even if the gate electrode is at the high level (as shown) the transistor does not turn on, because the gate-source potential difference is zero volts.

Figure 4:
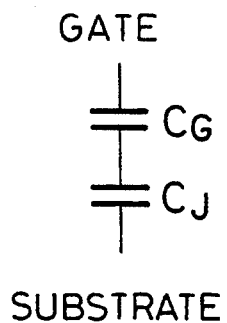
FIG. 4 is an equivalent circuit diagram illustrating the capacitance of the transistor in FIG. 3.

Referring to FIG. 4, as seen from the gate electrode, the transistors is equivalent to two capacitors connected in series, one capacitor representing the gate capacitance $C_G$ and the other the junction capacitance $C_J$. The combined capacitance is less than the gate capacitance alone, so this transistor presents a relatively small capacitive load to the address signal line. (More specifically, the combined capacitance is the reciprocal of the sum of the reciprocals of $C_G$ and $C_J$, which is less than $C_G$).

Figure 5:
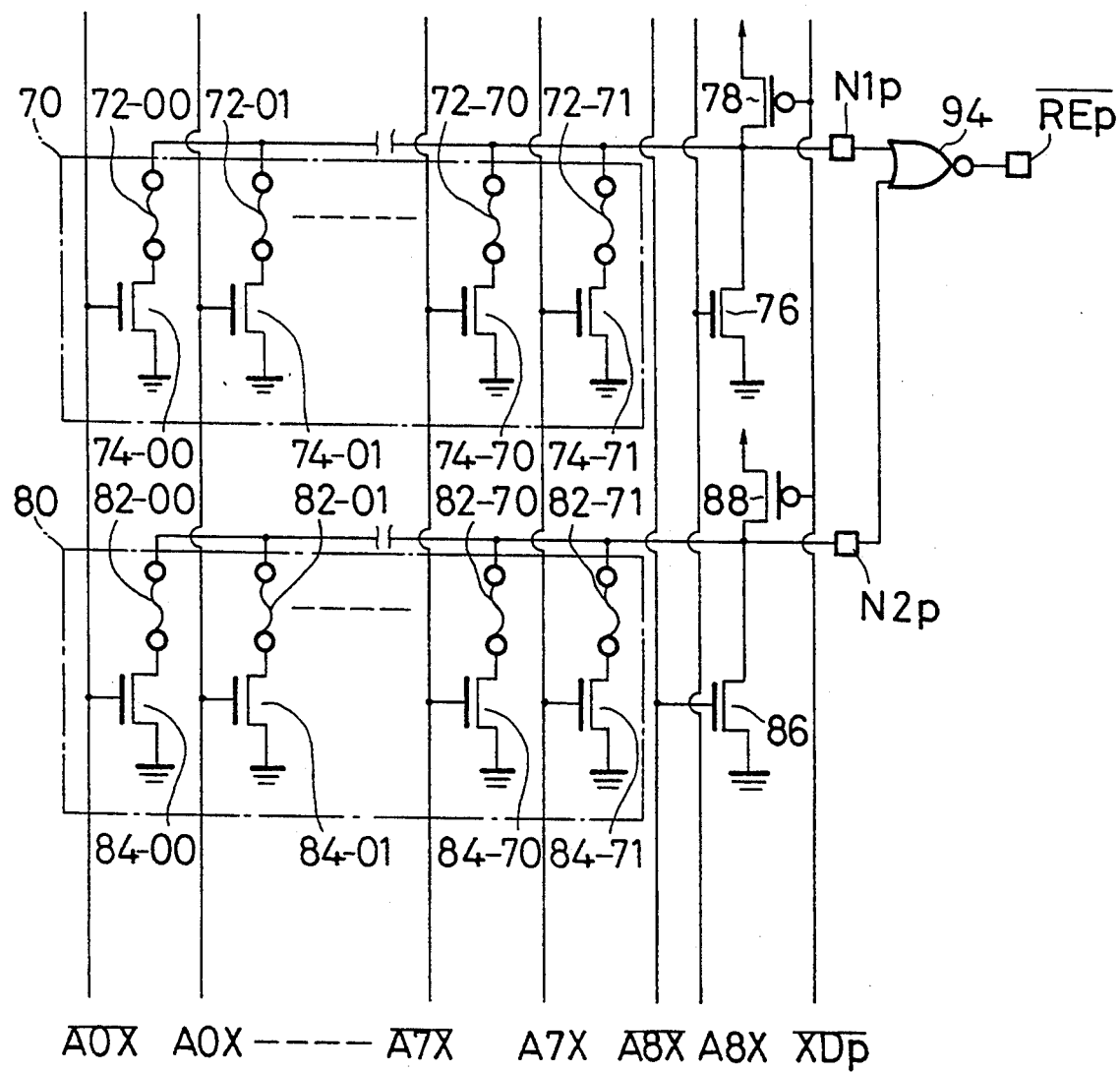
FIG. 5 is a circuit diagram of a prior-art fuse-programmable decoder.

For comparison, FIG. 5 shows a prior-art decoder. The first fuse-programmable ROM 70 with its fusible links 70-00 to 72-71 and NMOS transistors 74-00 to 74-71 is similar to the first fuse-programmable ROM 10 of the invention, except that the source electrodes to the transistors are grounded. The second fuse-programmable ROM 80 with its fusible links 82-00 to 82-71 and NMOS transistors 84-00 to 84-71 is similar to the second fuse-programmable ROM 30 of the invention, expect that the source electrodes of the transistors are grounded.

The fusible links 72-00 to 72-71 are coupled to a node N1p, and the fusible links 82-00 to 82-71 to a node N2p. Node N1p is coupled through an NMOS transistor 76 to ground, and through a PMOS transistor 78 to the power supply. Note N2p is coupled through an NMOS transistor 86 to ground, and through a PMOS transistor 88 to the power supply. The NMOS transistor 76 is driven by address signal A8X, and NMOS transistor 86 by address signal $\overline{A8X}$. The PMOS transistors 78 and 88 are driven by a precharge control signal $\overline{XDp}$. A NOR gate 94 performs a logic operation on the potentials at nodes N1p and N2p to generate the output signal $\overline{REp}$.

Figure 6:
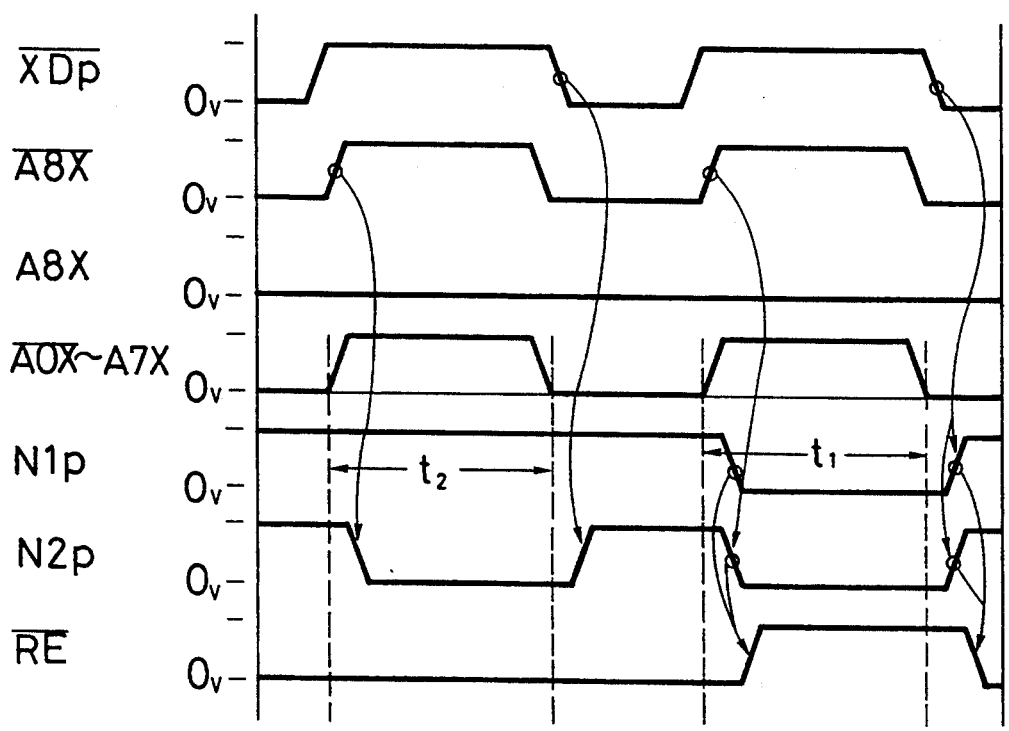
FIG. 6 is a timing diagram illustrating the operation of the prior-art fuse-programmable decoder.

FIG. 6 illustrated the operation of the prior-art decoder, under the same assumptions as in FIG. 2. Prior to address input, the $\overline{XDp}$ control signals goes low to precharge the nodes. When the input address matches the programmed address, as in interval $t_1$, node N2p discharges. The discharge current is somewhat greater than in the invented decoder, because the fusible links in the second fuse-programmable ROM 80 must be discharged as well as the wiring from these fusible links to the node N2p and the NOR gate 94.

When the input address does not match the programmed address, both nodes N1p and N2p discharged. This time the discharge current is much greater than in the invented decoder, because the capacitance represented by all circuit elements in both the first and second fuse-programmable ROMs 70 and ROM 80 must be discharged, whereas in the invented decoder only one fuse-programmable ROM 10 had to be discharged.

Figure 7:
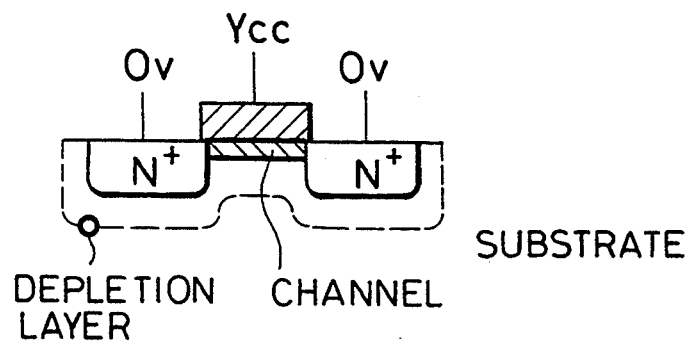
FIG. 7 a sectional view of a transistor in the prior-art fuse-programmable decoder.

FIG. 7 is a sectional view of one of one transistors in the second fuse-programmable ROM 80 of the prior-art decoder during the time intervals shown in FIG. 6. The source and drain electrodes are both at ground level, so if the gate is high, the transistor turns on, causing a channel to form under the gate, thereby eliminating the junction capacitance between the gate and ground.

Figure 8:
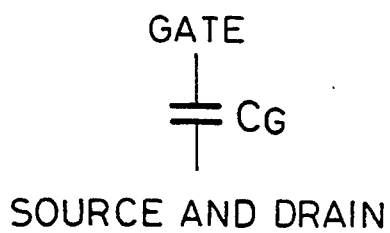
FIG. 8 is an equivalent circuit diagram illustrating the capacitance of the transistor in FIG. 7.

Referring to FIG. 8, the capacitance that must be charged by a high address signal is the gate capacitance $C_G$ alone, which exceeds the combined series capacitance in FIG. 4. The capacitive load on the address signal lines is therefore higher in the prior-art decoder than in the invented decoder.

Although the output signal $\overline{RE}$ has been described as selecting a redundant memory cell in an addresses section of the memory device, in many memory designs $\overline{RE}$ will be used to select a redundant word line and its plurality of coupled redundant memory cells, or a redundant pair of bit lines and their plurality of coupled redundant memory cells. The invention as not restricted to any particular redundancy scheme. In schemes with redundant word lines or redundant pairs of bit lines, the address signals shown in the drawings will be, for example, row address signals or column address signals.

In addition to the modifications needed to adapt the circuit in the drawings to a memory device divided into more than two sections, various other modifications can be made. For example, the logic of the output signal can be changed from active low to active high, the roles of the power supply and ground can be interchanged, and the number of address signals can be altered. These and sundry further modifications, which will be obvious to those skilled in the art, can be made without departing from the spirit and scope of the invention as set forth in the following claims.

What is claimed is:

1. A method of selecting redundant memory cells disposed in different sections of a memory device, comprising the steps of:
    (a) providing, for each of said sections, a separate pair of nodes consisting of a first node and a second node, and a fuse-programmable ROM for electrically coupling said first node to said second node;
    (b) testing each of said sections of said memory device for defective memory cells;
    (c) if a defective memory cell is found in a section of said memory device, programming the fuse-programmable ROM provided for that section so that said fuse-programmable ROM will not couple the first node provided for that section to the second node provided for that section when said defective memory cell is addressed;
    (d) precharging the pair of nodes provided for each of said sections to a first potential;
    (e) addressing a memory cell in one section from among said sections;
    (f) discharging the second node provided for said one section to a second potential different from said first potential;
    (g) inputting electrical potentials from the first node provided for each of said sections to a logic gate, thereby generating an output signal;
    (h) accessing the memory cell addressed in said one section if said output signal is in one state;
    (i) accessing a redundant memory cell in said one section if said output signal is in another state.

2. The method of claim 1, wherein said first potential is higher than said second potential.

3. The method of claim 1, wherein said logic gate is a NAND gate.

4. The method of claim 1, wherein said step (e) of addressing a memory cell in one section comprises a further step of generating pairs of complementary address signals.

5. The method of claim 4, wherein the fuse-programmable ROM provided for each section comprises a plurality of fusible links and a like plurality of field-effect transistors having source electrodes, drain electrodes, and gate electrodes, said gate electrodes being coupled to receive said complementary address signals, said source electrodes being coupled to the second node provided for said section, said drain electrodes being coupled to respective fusible links, and said fusible links being coupled to the first node provided for said section.

6. The method of claim 5, wherein said step (c) of programming the fuse-programmable ROM is carried out by cutting certain of said fusible links.

7. A fuse-programmable decoder powered by a first potential and a second potential, for receiving address signals designating memory cells in a selectable section of a memory device, comparing the address signals with stored information, and detecting whether the address signals match the stored information, comprising:
- a first node that is coupled to said first potential when said section is not selected, and decoupled from said first potential when said section is selected;
- a second node that is coupled to said first potential when said section is not selected, and coupled to said second potential when said section is selected; and
- a fuse-programmable ROM coupled to receive said address signals, for storing address information, and coupling said first node to said second node when said address signals do not match said address information.

8. The decoder of claim 7, wherein said fuse-programmable ROM comprises:
- a plurality of fusible links coupled to said first node; and
- a like plurality of field-effect transistors having source electrodes coupled to said second node, drain electrodes coupled to respective fusible links, and gate electrodes coupled to receive respective address signals.

9. The decoder of claim 8, wherein said first potential is higher than said second potential.

10. The decoder of claim 9, wherein said field-effect transistors are n-channel field effect transistors.

11. The decoder of claim 7, further comprising:
- a first transistor for coupling said first node to said first potential;
- a second transistor for coupling said second node to said first potential; and
- a third transistor for coupling said second node to said second potential.

12. The decoder of claim 11, wherein said first transistor and said second transistor are p-channel field-effect transistors, and said third transistor is an n-channel field-effect transistor.

13. The decoder of claim 12, wherein said first transistor, said second transistor, and said third transistor are driven by a single signal.

14. A fuse-programmable decoder powered by a first potential and a second potential for a memory having, for each integer i from one to a certain integer N greater than one, an i-th section with memory cells selected by address signals for storing data and redundant memory cells for replacing defective memory cells, comprising:
- for each integer i from one to N, an i-th first node that is coupled to said first potential when said i-th section is not selected, and decoupled from said first potential when said i-th section is selected; and
- for each integer i from one to N, an i-th second node that is coupled to said first potential when said i-th section is not selected, and coupled to said second potential when said i-th section is selected;
- for each integer i from one to N, an i-th fuse-programmable ROM for storing address information, receiving address signals, electrically coupling said i-th first node to said i-th second node when said address signals do not match said address information; and
- a logic gate coupled to receive an electrical potential from each i-th first node, where i ranges from one to N, for performing a logic operation and producing an output signal to select said redundant memory cells.

15. The decoder of claim 14, wherein for each integer i from one to N, said i-th fuse-programmable ROM comprises:
- a plurality of fusible links coupled to said i-th first node; and
- a like plurality of field-effect transistors having source electrodes coupled to said i-th second node, drain electrodes coupled to respective fusible links, and gate electrodes coupled to receive respective address signals.

16. The decoder of claim 15, wherein said first potential is higher than said second potential.

17. The decoder of claim 16, wherein said field-effect transistors are n-channel field effect transistors.

18. The decoder of claim 17, wherein said logic gate is a NAND gate.

* * * * *